(12) United States Patent
Kocon et al.

(10) Patent No.: US 9,136,381 B1
(45) Date of Patent: Sep. 15, 2015

(54) SUPER JUNCTION MOSFET WITH INTEGRATED CHANNEL DIODE

(71) Applicant: Texas Instruments Incorporated, Dallas, TX (US)

(72) Inventors: Christopher Boguslaw Kocon, Mountain Top, PA (US); John Manning Savidge Neilson, Norristown, PA (US); Simon John Molloy, Allentown, PA (US); Hideaki Kawahara, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/546,274

(22) Filed: Nov. 18, 2014

(51) Int. Cl.
  *H01L 29/78* (2006.01)
  *H01L 29/66* (2006.01)
  *H01L 23/482* (2006.01)

(52) U.S. Cl.
  CPC ...... *H01L 29/7832* (2013.01); *H01L 29/66712* (2013.01); *H01L 29/7802* (2013.01); *H01L 29/783* (2013.01); *H01L 29/7803* (2013.01); *H01L 23/4824* (2013.01); *H01L 2924/13091* (2013.01)

(58) Field of Classification Search
  CPC .............. H01L 29/783; H01L 29/7832; H01L 29/66712; H01L 29/7802; H01L 29/7803; H01L 29/0696; H01L 29/1095; H01L 27/0629; H01L 27/0727; H01L 23/4824; H01L 2924/13091
  See application file for complete search history.

(56) References Cited

U.S. PATENT DOCUMENTS

| 5,818,084 A | 10/1998 | Williams et al. |
| 2013/0328122 A1 | 12/2013 | Li et al. |

*Primary Examiner* — Armando Rodriguez
(74) *Attorney, Agent, or Firm* — Jacqueline J. Garner; Frank D. Cimino

(57) ABSTRACT

Semiconductor device includes MOSFET having planar cells on an epitaxial semiconductor surface of a first type providing a drain drift region. A first and second epitaxial column formed in the semiconductor surface are doped a second type. A split gate includes planar gates between the epitaxial columns including a MOS gate electrode (MOS gate) and a diode gate electrode (diode gate). A body region of the second type in the drift region abuts the epitaxial columns. A source of the first type in the body region includes a first source portion proximate to the MOS gate and a second source portion proximate to the diode gate. A vertical drift region uses the drift region below the body region to provide a drain. A connector shorts the diode gate to the second source portion to provide an integrated channel diode. The MOS gate is electrically isolated from the first source portion.

18 Claims, 5 Drawing Sheets

US 9,136,381 B1

SUPER JUNCTION MOSFET WITH INTEGRATED CHANNEL DIODE

CROSS-REFERENCE TO RELATED APPLICATIONS

This application has subject matter related to copending application Ser. No. 14/291,967 entitled "MOSFET HAVING DUAL-GATE CELLS WITH AN INTEGRATED CHANNEL DIODE" filed May 30, 2014.

FIELD

Disclosed embodiments relate to high-voltage metal-oxide-semiconductor field-effect transistors (MOSFETs), and more specifically super junction MOSFETs.

BACKGROUND

For conventional high-voltage MOSFETs, the voltage blocking capability in the drain drift region is developed by having a thick epitaxial region and light doping. This results in most of the device ON resistance being in the drain drift region, which cannot be improved by known approaches used for low-voltage transistors (e.g., cell shrink, trench cells and smaller cell pitch), where only a small portion of the ON resistance is in the drain drift region.

Super junction MOSFETs are known which feature a unique drain structure. The main current path is through a more heavily doped (typically by a factor of 10) region than the doping in the main current path for a conventional high-voltage MOSFET. This lowers the ON resistance of the drain. There are also columns under the MOS cell doped opposite to the drain which provides a charge compensation structure that raises the breakdown voltage. For conventional NMOS super junction devices, there are p-columns under the cell structure, which can raise the breakdown voltage to about 600V from would otherwise be about 100V. The current path of the p-column and n-doped structures are dimensioned so that when the transistor is turning OFF and developing the blocking voltage, the resulting depletion region forms with migration of the charge carriers from the p-doped columns, resulting in a near-neutral space charge region and as a result higher blocking-voltage capability.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize a large percentage of power metal-oxide-semiconductor field-effect transistor (MOSFET) losses in power converter circuits are due to the switching loss caused by the presence of the inherent body diode (a PN junction) between the source and drain terminals, where the body region is shorted to the source. Such losses are present for planar gate MOSFET designs. The body diode is also recognized to induce circuit electromagnetic interference (EMI) and voltage spikes during operation that can be destructive to the MOSFET and the other power convertor circuit elements on the semiconductor device.

Disclosed embodiments provide semiconductor devices including at least one super junction MOSFET cell that includes a planar (or lateral) split gate including an integrated channel diode ("diode gate") for one gate in parallel with a "MOS gate" for the other gate. The MOS gate is conventionally connected having separate contacts so that the gate, source and drain are electrically separated from its gate electrode, while the diode gate has its gate electrode and source intentionally shorted (e.g., by metal or polysilicon) together with the body to provide a diode connected transistor. The inclusion of an integrated channel diode has been found to provide enhanced device efficiency and reliability.

Disclosed super junction MOSFET cells are built on a thick epitaxial semiconductor layer that provides a drain drift region where the cells are bounded laterally by columns doped opposite to the drain doping so that there is provided alternating P doped columns and N doped columns. A body region of the second conductivity type opposite from the first conductivity type is in the drift region abutting the first and second epitaxial columns including a first body region under the MOS gate and a second body region under the diode gate. The cells include a largely vertical drain drift region under the body region.

Although disclosed super junction MOSFET cells are described herein as having a single MOS gate and a single diode gate, disclosed super junction MOSFET cells can include more than one MOS gate and/or more than one diode gate. A disclosed integrated channel diode (which can also be termed a "pseudo-Schottky diode") functions as a rectifier diode in which when forward biased the forward current flows primarily through a thin layer or channel along the top semiconductor surface of the device, rather than in the vertical direction through the bulk of the substrate.

As known in the art, a power MOSFET generally includes at least several hundred MOSFET cells electrically in parallel, typically several thousand MOSFET cells. Disclosed integrated channel diodes being super junction MOSFET cells with its diode gates shorted to its source and body, blocks the flow of current which would otherwise drive its mobile carriers from the source to drain, and allows current to freely flow in the direction for which carriers move (vertically).

A conventional silicon PN junction diode at room temperature has an offset (or turn-on) voltage of about 0.6 volts to 0.8 volts around room temperature before significant current begins to flow, because this is the voltage needed to overcome the built-in potential barrier of the PN junction. A disclosed integrated channel diode has a lower offset (or turn-on) voltage as compared to a conventional PN junction diode because the applied forward voltage being also applied to the diode gate acts as a gate bias which enhances the electrical conductivity of the channel region in the semiconductor surface under the diode gate, allowing carriers to flow through the channel without having to receive enough energy to "go over" the full height of the potential barrier. The lower offset voltage provided is advantageous because it results in less power loss, and more efficient operation for MOSFETs having disclosed integrated channel diodes as compared to conventional PN junction body diodes. Moreover, disclosed super junction MOSFETs for power converter circuits reduce reverse recovery switching losses combined with lower EMI and peak voltage ringing compared to otherwise equivalent MOSFETs.

BRIEF DESCRIPTION OF THE DRAWINGS

Reference will now be made to the accompanying drawings, which are not necessarily drawn to scale, wherein.

DETAILED DESCRIPTION

Figure 1:
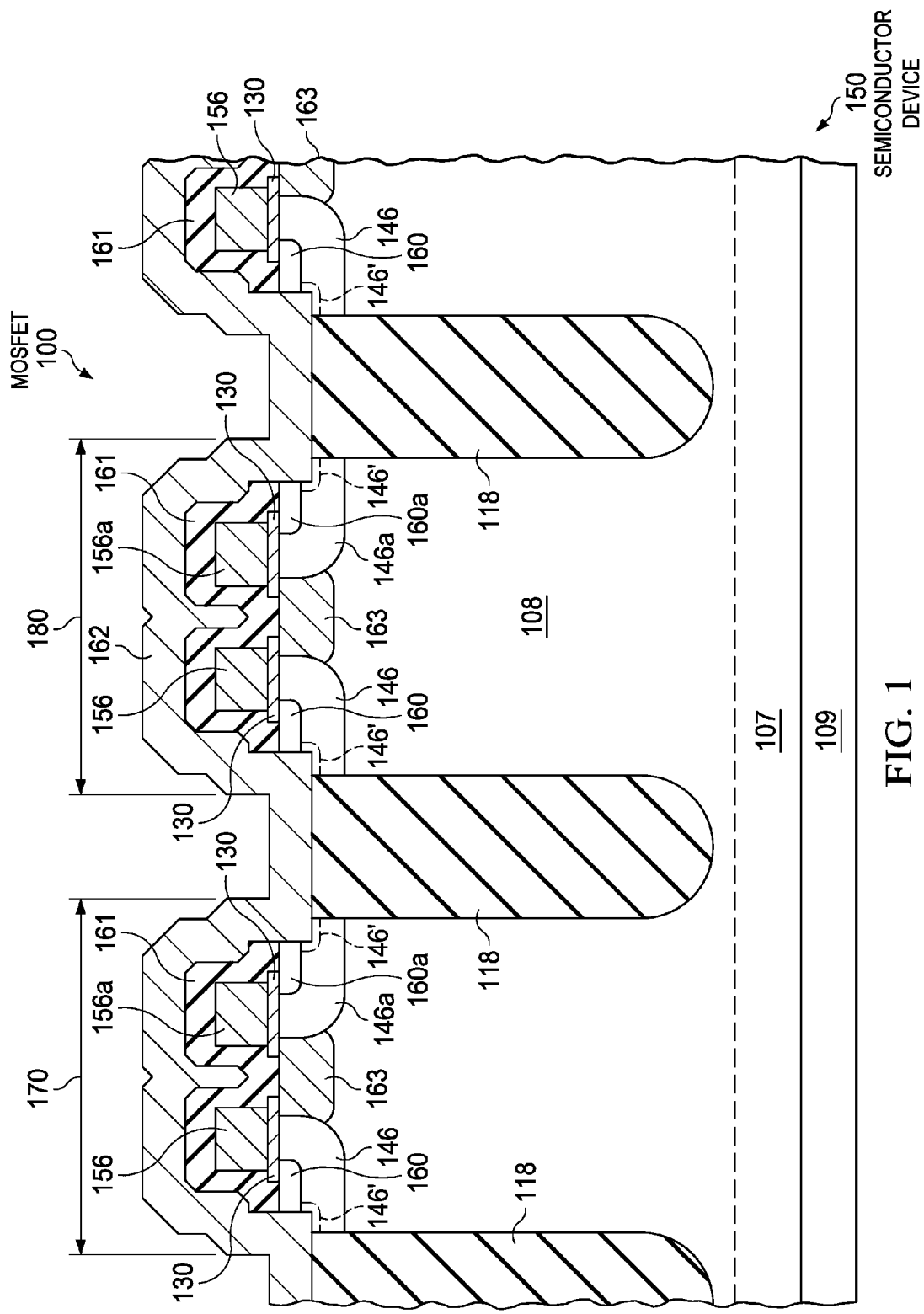
FIG. 1 is a cross sectional view of a semiconductor device including a portion showing a disclosed super junction MOS- FET having split gate planar cells showing two n-channel super junction MOSFET cells, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a cross sectional view of an example semiconductor device 150 built on an epitaxial n-semiconductor surface (n-drift region) 108 of a substrate 107 including a portion of a n-channel MOSFET 100 (MOSFET 100) showing two super junction n-channel MOSFET split gate planar cells 170 and 180, according to an example embodiment. MOSFET split gate planar cells 170 and 180 have alternating MOS gate electrode stripes (shown in FIG. 1 and hereafter referred to as "MOS gates" 156) and diode gate electrode stripes (shown in FIG. 1 and hereafter referred to as "diode gates" 156a). The MOS gates 156 are for one gate of the super junction MOSFET cells having a conventional separate gate, source, and drain, with the source tied to the body, which operates as a 3-terminal MOSFET, and the other gate is a diode gate configured as an integrated channel diode cell having a gate, source and drain, with the gate, source and body shorted together to operate as 2-terminal integrated channel diode (see, e.g., FIG. 3 described below showing source metal shorting to the diode gates to the source and body). Although the super junction MOSFETs described herein including MOSFET 100 are described as being n-channel MOSFETs, disclosed embodiments also include p-channel MOSFETs which can be achieved as known in the art by changing the semiconductor type dopings from p to n-type and from n to p type, with appropriate change to the doping levels.

MOSFET 100 includes n+ doped source regions shown as 160a for the diode gates 156a and n+ doped source regions 160 for the MOS gates 156. MOSFET 100 includes p-doped body regions 146 for MOS gates 156 and p-doped body regions 146a for the diode gates 156a. As described below, p-doped body regions 146 and p-doped body region 146a can be doped differently. The p-doped body regions 146 and 146a have a p+ contact 146'. As described below, the top metal shown as "source metal" 162 in FIG. 1 can be connected to the source regions 160a associated with the diode gates 156a, source regions 160 associated with the MOS gates 156, the diode gates 156a, and to the p-doped body region 146 and p-doped body region 146a.

N channel MOSFET cell 180 and n-channel MOSFET cells 170 are both shown including a split gate structure, where the diode gates 156a when connected by source metal 162 becomes the anode region of the integrated channel diode. The n-semiconductor surface (n-drift region) 108 on the substrate 107 that is generally doped n+ is the common drain of the n-channel MOSFET cells 170 and 180, which becomes the cathode region of the integrated channel diode.

The P-epi columns 118 being under the cells raise the breakdown voltage of the cells, such as to at least about 600V. The cell breakdown voltage can be extended to even higher voltages, such as to 800V or to 1000V, by using a thicker n-drift region 108 which is generally an epitaxially oriented layer with respect to the substrate 107. With a thicker n-drift region 108, the trench filled by the P-epi columns 118 would generally be made deeper to match with the n-drift region 108 thickness and the doping level in the n-drift region 108, and the P-epi columns 118 would generally be adjusted to maintain an appropriate charge balance.

Disclosed integrated channel diodes have a significant advantage recognized herein in that they provide a faster recovery during the transition from forward conduction to reverse blocking as compared to a conventional PN junction. This occurs because the channel current for disclosed integrated channel diodes have only one kind of carrier, while the current across a conventional PN junction includes both kinds of carriers, both holes and electrons. After a PN junction diode has carried a forward current, the voltage-supporting region contains a mixture of both kinds of carriers, and cannot support a reverse voltage until enough time has passed for these excess carriers to recombine or to be removed by reverse current flow. This additional current during reverse recovery of the conventional PN junction diode is considered as power loss and a reason for circuit EMI noise and voltage oscillation. On the other side, forward current in the integrated channel diode is carried by only a single type of carrier, so the voltage-supporting region contains no excess carriers, and is essentially immediately ready to begin supporting reverse voltage when operated at a forward voltage below the PN junction barrier voltage.

The substrate 107 and/or n-drift region 108 more generally can comprise silicon, silicon-germanium, or other semiconductor material including III-V or II-VI materials. In one particular arrangement the n-drift region 108 is epitaxially oriented relative to the substrate 107, such as n-epitaxial layer on an n+ substrate for NMOS, or as p-epitaxial layer on a p+ substrate for PMOS embodiments. Another example is a silicon/germanium (SiGe) epitaxially grown on a silicon substrate.

The MOSFET cells 170 and 180 cells are bounded laterally by a pair of P-epi columns 118 so that there is provided alternating P doped columns provided by the P-epi columns 118 and N doped columns provided by n-drift region 108. Source metal 162 is shown contacting the P-epi columns 118.

The P-epi columns 118 may be formed by etching a deep trench in the n-drift region 108, such as using a reactive ion etching (RIE) apparatus. The trenches can then be filled with a selective epitaxial growth process forming P-type Si. The n-drift region 108 is generally at least 30 µm thick, and the first and second P-epi columns 118 is generally at least 20 µm thick (several microns thinner than the n-drift region 108). The n-drift region 108 can be 80 µm to 100 µm thick and the P-epi columns 118 can be 50 µm to 70 µm thick.

The source metal 162 can be replaced by other electrically conductive layers such as a heavily doped polysilicon layer. The P-epi columns 118 is generally at least 2 µm in width.

A dielectric layer shown as an interlayer dielectric (ILD) layer 161 is shown over the top of the MOS gates 156 and diode gates 156*a*. In one embodiment the ILD layer 161 comprises a tetra-ethoxy-silane (TEOS) derived silicon oxide layer.

A p-doped body region 146 and p-doped region 146*a* are each formed in the n-drift region 108, which as noted above can be epitaxial relative to the substrate 107. N-type dopants are in the source regions 160 and 160*a* formed in the p-doped body regions 146 and 146*a*. Although not shown, the respective gates can each include gate sidewall spacers. The gate dielectric layer is shown as 130. A patterned polysilicon layer can provide MOS gate 156 and diode gate 156*a* which are both over the gate dielectric layer 130.

N-type lightly doped drain (LDD) regions are shown as 163. The drain for MOSFET device 100 is a vertical drain drift region that uses the entire n-drift region 108 below the p-doped body region 146 (so that no reference number for the drain is shown in FIG. 1A), which has a drain contact (e.g. drain metal) 109 on the bottom side of the substrate 107, where substrate 107 can be an n+ substrate, such as an n+ silicon substrate. For p-channel MOSFET embodiments, substrate 107 can be a p+ substrate, such as a p+ silicon substrate.

The polysilicon layer when used for the gate electrode for the MOS and diode gates 156, 156*a* may include about 100 to 200 nanometers of polysilicon and possibly a layer of metal silicide (not shown) on the polysilicon, such as 100 to 200 nanometers of tungsten silicide. Other materials for the MOS and diode gates 156 and 156*a* are within the scope of this Disclosure.

Disclosed integrated channel diodes can be manufactured using the same threshold voltage ($V_T$) as the MOS gates by each having the same p-doped body region 146 doping. In this arrangement typically no changes are needed to the process flow, since shorting of diode gate to the source contact (and body contact) can be performed through a single contact mask layout change. However, in another embodiment, the performance of the integrated channel diode can be further improved in performance if the $V_T$ of the integrated channel diode is lowered in absolute value (lower for NMOS or made less negative for PMOS) as compared to the $V_T$ of the MOS gates. The reason is that a lower threshold in absolute value results in the integrated channel diode having lower $V_f$ (forward voltage drop) due to being turned on at a lower forward bias voltage. Also, the integrated channel diode will conduct more current than the conventional MOS gate, due to being lower Vf. An additional benefit as described above is lower reverse recovery due to most of current being MOS-gated diode current rather than parasitic MOS's body diode.

$V_T$ lowering for disclosed integrated channel diodes can be implemented by adjustment of body or source implant in the integrated channel diode area only. In one embodiment the p-doped body region 146 has a different doping level for the super junction MOS transistor cell portion as compared to the integrated channel diode cell portion. For example, the p-body region for the MOS gate transistors for NMOS embodiments can be have a doping level of about 2 or $3 \times 10^{17}$ cm$^{-3}$, as compared to a lower doping level by at least a factor of 2, such as around $5 \times 10^{16}$ cm$^{-3}$ for the diode gate transistor to provide a lower $V_T$. For PMOS embodiments the n-body region for the MOS gate transistors can have a doping level of about $1 \times 10^{17}$ cm$^{-3}$ to $2 \times 10^{17}$ cm$^{-3}$, as compared to a lower doping level by at least a factor of 2, such as around $3 \times 10^{16}$ cm$^{-3}$ to $5 \times 10^{16}$ cm$^{-3}$ for the diode gate transistor to provide a lower $|V_T|$.

Figure 2:
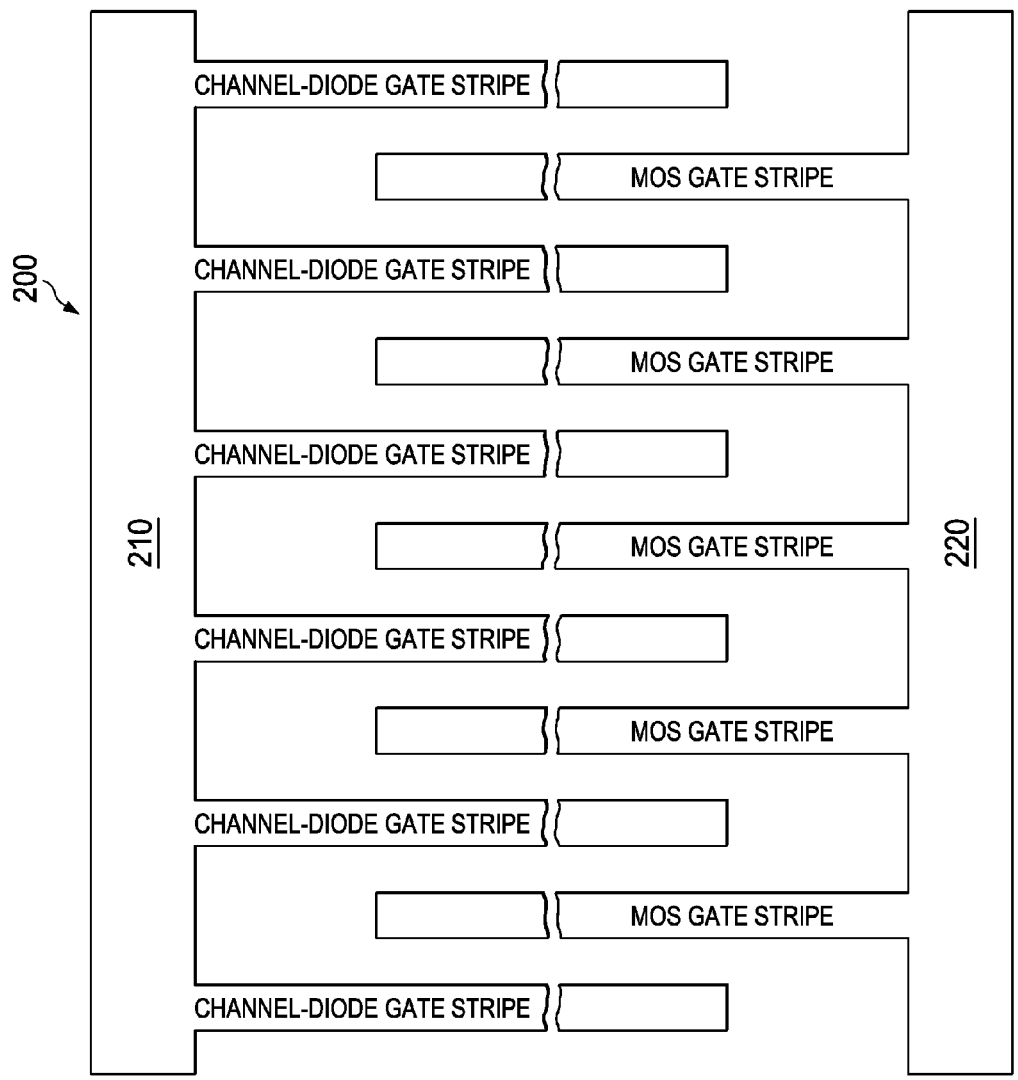
FIG. 2 is a top view depiction showing an example super junction MOSFET having split gate planar cells including alternating (interdigitated) diode gate and MOS gate contacts for a split gate embodiment including integrated channel diode stripes and MOS gate stripes, according to an example embodiment.

FIG. 2 is a top view depiction of an example MOSFET 200 (MOSFET 200) having split gate planar cells including alternating (interdigitated) diode gate and MOS gate contacts including integrated channel diode stripes and MOS gate stripes, according to an example embodiment. In this embodiment, on one end of the MOSFET 200 a first bus 210 that can comprise polysilicon, or metal (aluminum, copper or tungsten) ties (shorts) together all the source electrodes (and the bodies) to all of the diode gate stripes of the integrated channel diodes, while on the opposite end a second bus 220 that can also comprise polysilicon or metal ties (shorts) together all the MOS gate stripes. Although as shown in FIG. 2 all polysilicon gate stripes for both the diode gate stripes and the MOS gate stripes are each connected by common bus, in an alternate design there can be individual contacts to each stripe. Although shown as MOS gate stripes alternating with diode gate stripes, there can also be a smaller or larger percentage of diode gates relative to MOS gates by adjustment of the gate contact ratio between the first bus 210 and the second bus 220.

Figure 3:
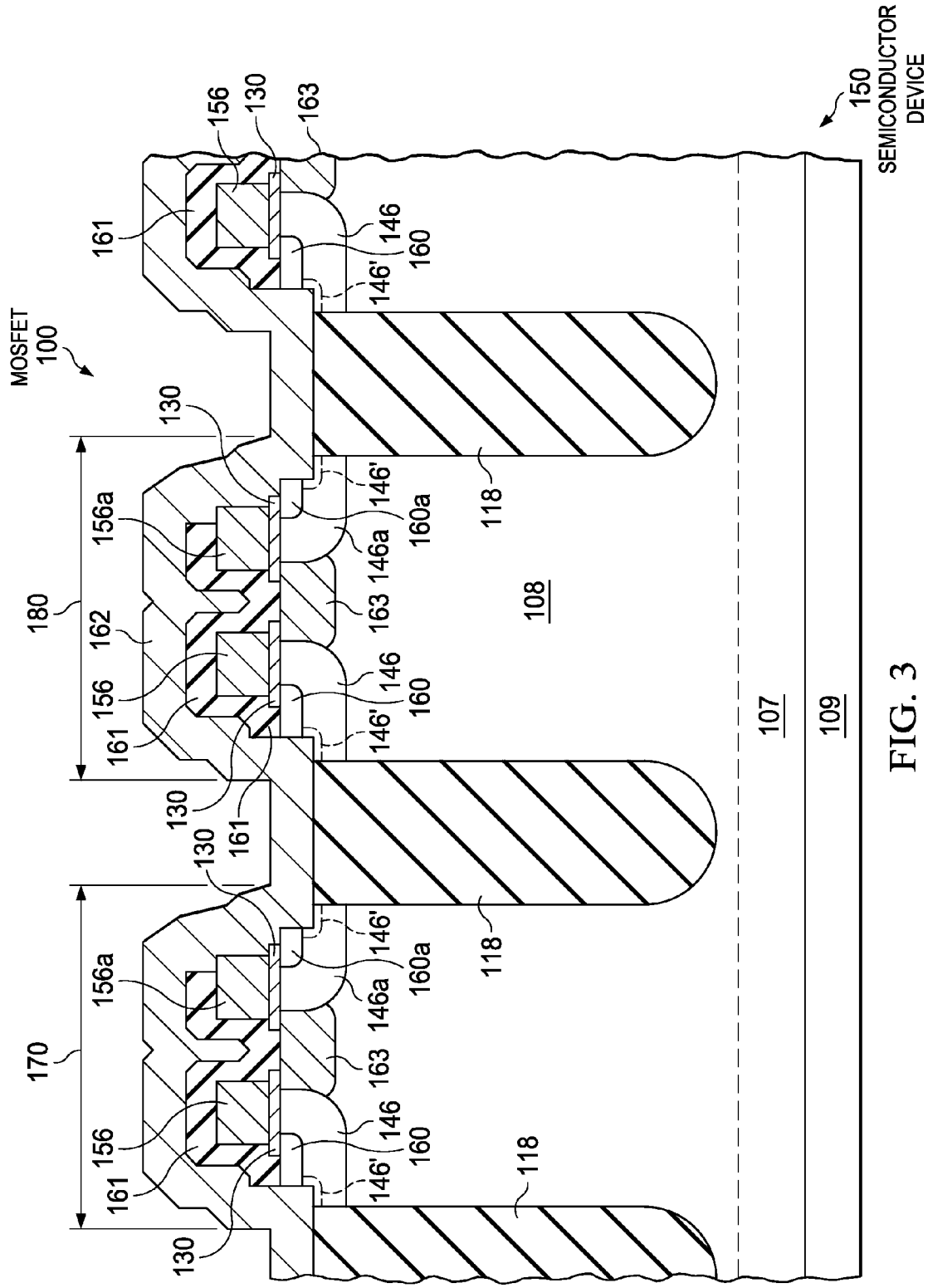
FIG. 3 is a cross sectional view of the semiconductor device shown in FIG. 1A along a cut where the diode gates of the cells contact the source metal along lengths of diode gate stripes, according to an example embodiment.

FIG. 3 is a cross sectional view of the semiconductor device 150 shown in FIG. 1A along a cut where the diode gates 156*a* of the cells of the super junction MOSFET 100 contact the source metal 162 along lengths of diode gate stripes, according to an example embodiment. The ILD 161 can be seen to terminate on the top of the diode gates 156*a* to allow the source metal 162 to short to the diode gate 156*a* along the sidewall of the diode gate 156*a* to its source regions 160*a* and p-doped body region 146*a*.

Figure 4:
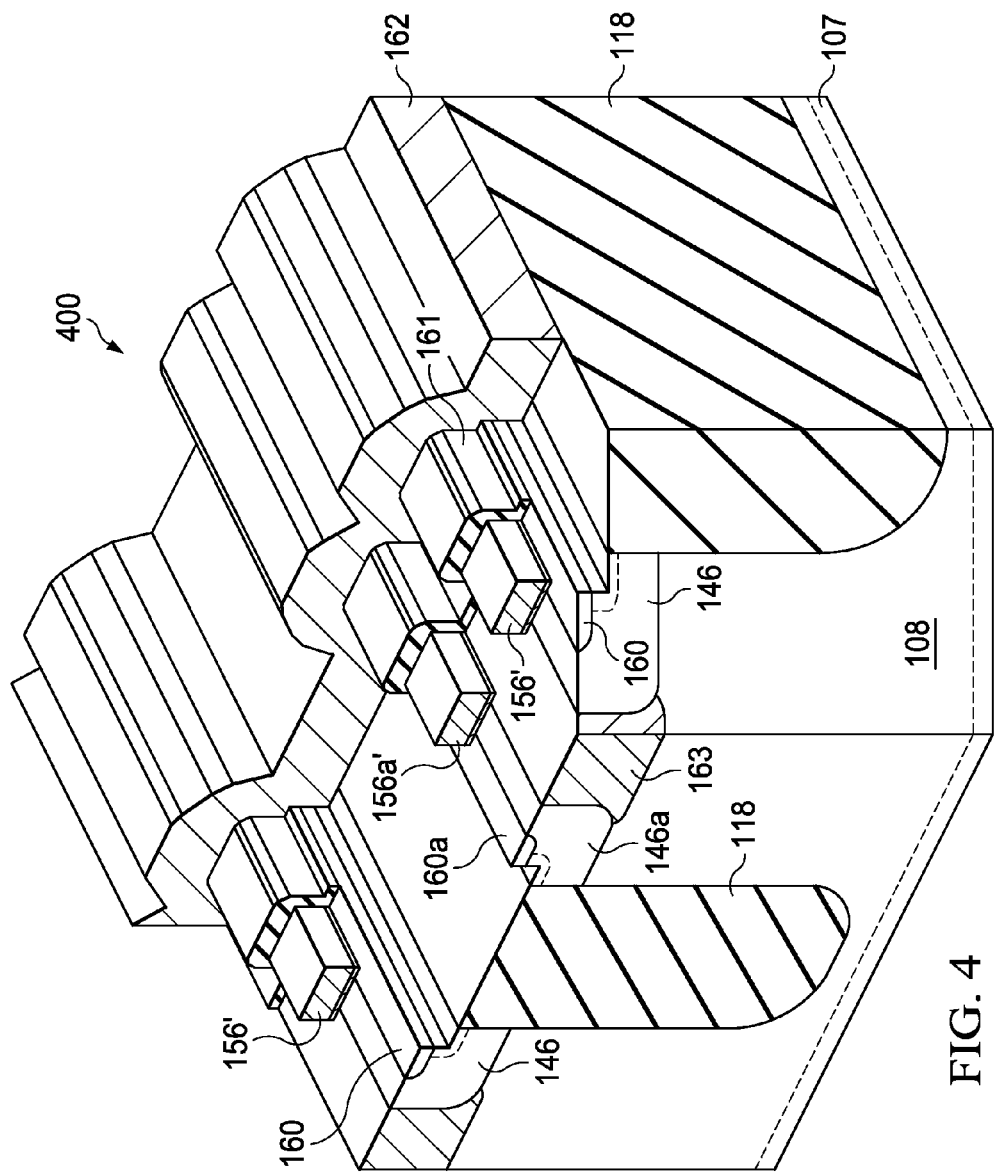
FIG. 4 is a perspective cross sectional view of an example super junction MOSFET having split gate planar cells including active area trenches which are oriented in the same direction as the diode gate stripes and MOS gate stripes, according to an example embodiment.

FIG. 4 is a perspective cross sectional view of an example n-channel super junction MOSFET 400 (MOSFET 400) having split gate planar cells including P-epi columns 118 which are oriented in the same direction as the diode gate stripes 156*a*' and MOS gate stripes 156', according to an example embodiment. The diode gate stripe 156*a*' and other diode gate stripes can all be shorted on one end to the source regions 160, 160*a* by the source metal 162 shown (which as noted above can also be shorted by other electrically conductive materials such as polysilicon). The MOS gate stripes 156' of respective cells can be shorted together on either end by metal or polysilicon.

Figure 5:
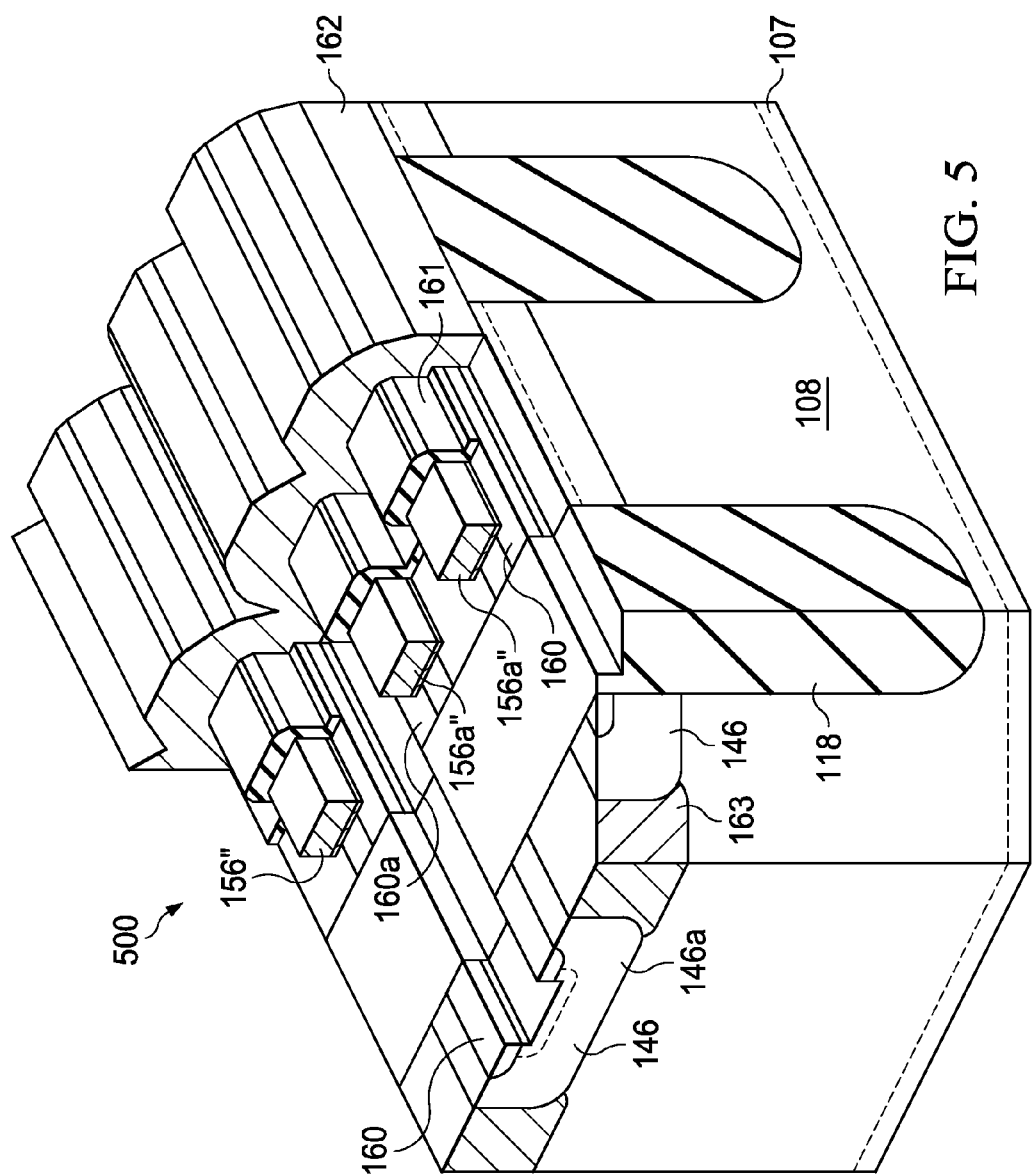
FIG. 5 is a perspective cross sectional view of an example super junction MOSFET having split gate planar cells including active area trenches which are oriented 90° to a direction of the diode gate stripes and MOS gate stripes according to an example embodiment.

FIG. 5 is a perspective cross sectional view of an example super junction MOSFET 500 (MOSFET 500) having split gate planar cells including P-epi columns 118 which are oriented 90° relative to a direction of the diode gate stripes 156*a*" and MOS gate stripes 156" according to an example embodiment. The diode gate stripe 156*a*" and other diode gate stripes can all be shorted to the source regions 160, 160*a* and the p-doped body regions 146, 146*a* by the source metal 162 shown.

Disclosed process flows to implement disclosed MOSFETs provide ease of implementation with the ability to change a single contact mask change to enable formation of disclosed integrated channel diodes for one of the gates in the split gate cells. For the embodiment described above having a lower Vt integrated channel diodes as compared to the MOS gates, the process will generally add another step to allow $|V_T|$ lowering, such as by adjustment of a p-body (for NMOS) doping (e.g., implantation) or n-body doping (e.g., implantation) for PMOS, or a source implant in the integrated channel diode area only.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS. The semiconductor die can also be a discrete die.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A semiconductor device, comprising:
   a substrate including an epitaxial semiconductor surface of a first conductivity type;
   a metal oxide semiconductor field effect transistor (MOSFET) in and on said semiconductor surface which provides a drift region of said first conductivity type, said MOSFET comprising a plurality of MOSFET cells each including:
      a first and a second epitaxial column formed within said semiconductor surface doped a second conductivity type opposite to said first conductivity type;
      a split planar gate between said first and said second epitaxial column, said split gate being configured to provide a MOS gate electrode (MOS gate) and a diode gate electrode (diode gate);
      a body region of said second conductivity type in said drift region abutting said first and said second epitaxial column including a first body region under said MOS gate and a second body region under said diode gate;
      a source of said first conductivity type formed in said body region including a first source portion proximate to said MOS gate and a second source portion proximate to said diode gate;
      a vertical drift region using said drift region below said first and second body regions providing a drain having a drain contact on a bottomside of said substrate, and
      a connector shorting said diode gate to said second source portion to provide an integrated channel diode, wherein said MOS gate is electrically isolated from said first source portion.

2. The semiconductor device of claim 1, wherein said first conductivity type comprises n-type and said second conductivity type comprises p-type.

3. The semiconductor device of claim 2, wherein said semiconductor surface comprises an n-type epitaxial layer that is at least 30 µm thick, and wherein said first and said second epitaxial column are at least 20 µm thick.

4. The semiconductor device of claim 1, wherein said second body region is lighter in doping by at least a factor of two (2) as compared to said first body region.

5. The semiconductor device of claim 1, wherein a gate electrode for said MOS gate and for said diode gate both comprise polysilicon.

6. The semiconductor device of claim 1, wherein said connector comprises a metal.

7. The semiconductor device of claim 1, wherein said connector comprises doped polysilicon.

8. The semiconductor device of claim 1, wherein said semiconductor surface comprises silicon.

9. The semiconductor device of claim 1, further comprising a first bus connecting said MOS gates of said plurality of MOSFET cells together and a second bus connecting said diode gates of said plurality of MOSFET cells together and to said second source portions.

10. A semiconductor device, comprising:
    a substrate including an epitaxial semiconductor surface doped n-type;
    a metal oxide semiconductor field effect transistor (MOSFET) in and on said semiconductor surface which provides a drift region doped said n-type, said MOSFET comprising a plurality of MOSFET cells each including:
       a first and a second epitaxial column formed in said semiconductor surface doped p-type;
       a split planar gate between said first and said second epitaxial column, said split gate being configured to provide a MOS gate electrode (MOS gate) and a diode gate electrode (diode gate);
       a body region of said p-type (p-body region) in said drift region abutting said first and said second epitaxial column including a first p-body region under said MOS gate and a second p-body region under said diode gate;
       a source of said n-type formed in said body region including a first source portion proximate to said MOS gate and a second source portion proximate to said diode gate;
       a vertical drift region using said drift region below said first and second body regions providing a drain having a drain contact on a bottomside of said substrate, and
       a connector shorting said diode gate to said second source portion to provide an integrated channel diode, wherein said MOS gate is electrically isolated from said first source portion.

11. The semiconductor device of claim 10 wherein said semiconductor surface comprises an epitaxial layer that is at least 30 µm thick, and wherein said first and said second epitaxial column are at least 20 µm thick.

12. The semiconductor device of claim 10, wherein said second p-body region is lighter in doping by at least a factor of two (2) as compared to said first p-body region.

13. A method of fabricating a semiconductor device, comprising:
    providing a substrate including an epitaxial semiconductor surface of a first conductivity type;
    forming a metal oxide semiconductor field effect transistor (MOSFET) in and on said semiconductor surface which provides a drift region of said first conductivity type, including:
       forming a first and a second epitaxial column within said semiconductor surface doped a second conductivity type opposite to said first conductivity type;
       forming a split planar gate between said first and said second epitaxial column, said split gate configured to provide a MOS gate electrode (MOS gate) and a diode gate electrode (diode gate);
       forming a body region of said second conductivity type in said drift region abutting said first and said second epitaxial column including a first body region under said MOS gate and a second body region under said diode gate;

forming a source of said first conductivity type in said body region including a first source portion proximate to said MOS gate and a second source portion proximate to said diode gate;

forming a vertical drift region using said drift region below said first and second body regions providing a drain having a drain contact on a bottomside of said substrate, and forming a connector shorting said diode gate to said second source portion to provide an integrated channel diode, wherein said MOS gate is electrically isolated from said first source portion.

14. The method of claim 13, wherein said forming said first and said second epitaxial column comprises etching a trench in said semiconductor surface and then filling said trench using a selective epitaxial process.

15. The method of claim 13, wherein said first conductivity type comprises n-type and said second conductivity type comprises p-type.

16. The method of claim 15, wherein said semiconductor surface comprises an n-type epitaxial layer that is at least 30 μm thick, and wherein said first and said second epitaxial column are at least 20 μm thick.

17. The method of claim 13, wherein said forming said first body region and said second body region comprises doping said second body region lighter in doping by at least a factor of two (2) as compared to a doping in said first body region.

18. The method of claim 13, wherein said forming said MOSFET comprises forming a polysilicon gate electrode for said MOS gate and for said diode gate.

* * * * *